(12) United States Patent
Lai et al.

(10) Patent No.: US 7,183,583 B2
(45) Date of Patent: Feb. 27, 2007

(54) GALLIUM-NITRIDE BASED LIGHT EMITTING DIODE STRUCTURE AND FABRICATION THEREOF

(75) Inventors: Mu-Jen Lai, Jhongli (TW); Schang-Jing Hon, Bade (TW)

(73) Assignee: Super Nova Optoelectronics Corporation, Taipei (TW)

( * ) Notice: Subject to any disclaimer, the term of this patent is extended or adjusted under 35 U.S.C. 154(b) by 105 days.

(21) Appl. No.: 11/020,737

(22) Filed: Dec. 22, 2004

(65) Prior Publication Data

US 2005/0139840 A1 Jun. 30, 2005

(30) Foreign Application Priority Data

Dec. 25, 2003 (TW) ............... 92136888 A

(51) Int. Cl.
*H01L 29/22* (2006.01)
(52) U.S. Cl. .......................... 257/95; 257/99
(58) Field of Classification Search ............. 257/95, 257/99, 103, 750
See application file for complete search history.

(56) References Cited

U.S. PATENT DOCUMENTS

2005/0139840 A1* 6/2005 Lai et al. .................. 257/79

* cited by examiner

*Primary Examiner*—Mark V. Prenty

(57) ABSTRACT

A method for fabricating GaN-based LED is provided. The method first forms a first contact spreading metallic layer on top of the texturing surface of the p-type ohmic contact layer. The method then forms a second and a third contact spreading metallic layers on top of the first contact spreading layer. The p-type transparent metallic conductive layer composed of the three contact spreading metallic layers, after undergoing an alloying process within an oxygenic or nitrogenous environment under a high temperature, would have a superior conductivity. The p-type transparent metallic conductive layer could enhance the lateral contact uniformity between the p-type metallic electrode and the p-type ohmic contact layer, so as to avoid the localized light emission resulted from the uneven distribution of the second contact spreading metallic layer within the third contact spreading metallic layer. The GaN-based LED's working voltage and external quantum efficiency are also significantly improved.

11 Claims, 6 Drawing Sheets

GALLIUM-NITRIDE BASED LIGHT EMITTING DIODE STRUCTURE AND FABRICATION THEREOF

BACKGROUND OF THE INVENTION

1. Field of the Invention

The present invention generally relates to gallium-nitride based light emitting diodes and, more particularly, to the structure and fabrication method of a transparent metallic conductive layer for enhancing the gallium-nitride based light emitting diodes' luminous uniformity.

2. The Prior Arts

A gallium-nitride (GaN) based light-emitting diode (LED) having a conventional structure as shown in FIG. 1 is usually grown on a sapphire substrate. The conventional GaN-based LED contains a number of GaN-based epitaxial layers on top of a side of the sapphire substrate 101. These epitaxial layers are sequentially stacked from bottom to top in the following order on the sapphire substrate 101: a low-temperature GaN buffer layer 102, a high-temperature GaN buffer layer 103, an n-type GaN ohmic contact layer 104, an indium-gallium-nitride (InGaN) active layer 105, a p-type aluminum-gallium-nitride (AlGaN) cladding layer 106, a p-type GaN ohmic contact layer 107, and a p-type transparent metallic conductive layer 108. Then, on top of the p-type transparent metallic conductive layer 108, there is a p-type metallic electrode 109. Additionally, on top of the n-type GaN ohmic contact layer 104, there is an n-type metallic electrode 110.

Within this conventional GaN-based LED, the GaN-based epitaxial layers (i.e., the LED itself), the sapphire substrate 101, and the resin packaging material (not shown) have refraction indices 2.4, 1.77, and 1.5 respectively. Due to such a variation in terms of the refraction indices, only up to 25% of the lights generated by the InGaN active layer 105 could directly escape from the GaN-based LED. The rest 75% of the lights are confined by a waveguide structure formed by the sapphire substrate 101 and the resin packaging material. The 75% of the lights also have a high probability to be absorbed again after undergoing multiple reflections within the LED and, therefore, cannot be effectively utilized. In other words, the light emitting efficiency of the conventional GaN-based LED is inherently limited by the re-absorption of the transparent metallic conductive layer and the LED's internal epitaxial structure.

In addition, as the p-type GaN ohmic contact layer 107 has a rather low conductivity with its resistivity coefficient generally between 1–2 Ωcm for a thickness between 0.1–0.5 μm, the electrical current is confined in area having a lateral distance about 1 μm under the p-type metallic electrode 109. Therefore, to distribute the electrical current evenly so as to achieve uniform lighting, the p-type transparent metallic conductive layer 108 is formed on top of the p-type GaN ohmic contact layer 107 and covers the entire light emitting area. To enhance its transparency, the p-type transparent metallic conductive layer 108 has to be rather thin. The p-type transparent metallic conductive layer 108 therefore is usually made of Ni and Au, and has a thickness between 50 and 500 Å.

According to researches on the transparent metallic conductive layer made of Ni and Au, in order to lower the GaN-based LED's working voltage, the contact resistivity between the p-type transparent metallic conductive layer and the p-type ohmic contact layer has to be reduced effectively. On the other hand, to enhance the GaN-based LED's external quantum efficiency, the p-type transparent metallic conductive layer must have at least 80% transparency for visible lights whose wavelength is between 400–700 nm. According to an article published in Applied Physics Letters (Vol. 74, 1999, p1275), a NiO semiconducting intermediate layer formed by annealing in an oxygenic environment could effectively reduce contact resistivity and enhance transparency. Another article published on Solid-state Electronics (Vol. 47, 2003, p1741) pointed out that, to effectively enhance transparency, the thickness of Ni and Au should be as small as possible while, to effectively reduce contact resistivity, the thickness of Ni and Au should be as large as possible.

To effectively disrupt the foregoing waveguide structure so as to enhance the LED's luminous efficiency, the p-type ohmic contact layer 107's surface could be arranged to have a texturing surface. FIG. 2 is a schematic diagram showing an enlargement of the interface 120 between the p-type transparent metallic conductive layer 108 and the p-type ohmic contact layer 107 as depicted in FIG. 1. As shown in FIG. 2, Ni and Au are used to form the p-type transparent metallic conductive layer 108 on the texturing surface. When alloyed in an oxygenic environment, the Au layer 108a is very easy to have an uneven distribution within the NiO layer 108b. This would cause uneven lateral distribution of electrical current, localized light emission, and increase of working voltage.

Therefore, using Ni and Au bilayered structure to form the p-type transparent metallic conductive layer on the texturing surface of GaN-based LED's p-type ohmic contact layer, according to the foregoing limitations, still has room for improvement.

Accordingly, there is a need for a better structure for forming the p-type transparent metallic conductive layer so that not only the luminous uniformity of the texturing surface could be improved, the GaN-based LED's working voltage and external quantum efficiency could be enhanced as well.

SUMMARY OF THE INVENTION

The present invention provides a new structure for the p-type transparent metallic conductive layer. The present invention first forms a first contact spreading metallic layer on top of the texturing surface of the p-type ohmic contact layer. The present invention then forms a second and third contact spreading metallic layers on top of the first contact spreading metallic layer. The three-layered p-type transparent metallic conductive layer is alloyed under a high temperature within an oxygenic or nitrogenous environment and has a superior conductivity.

For GaN-based LEDs fabricated according to the present invention, the first contact spreading metallic layer is extremely thin so that lights emitted out of the active layer are neither absorbed nor reflected. The first contact spreading metallic layer could also enhance the lateral contact uniformity between the p-type metallic electrode and the p-type GaN ohmic contact layer, so as to avoid the localized light emission resulted from the uneven distribution of the second contact spreading metallic layer within the third contact spreading metallic layer. The GaN-based LED's working voltage and external quantum efficiency are also significantly improved.

The fabrication method according to the present invention does not have a mechanism to cause the first contact spreading layer to have an uneven lateral distribution under a high temperature. The GaN-based LED's characteristics and stability are thereby preserved.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The accompanied drawings are provided to illustrate the various embodiments of the present invention as described in this specification, so as to achieve better understanding of the major objectives of the present invention.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

FIGS. 3(a)–3(d) are schematic diagrams showing the epitaxial structure of a GaN-based LED after the processing steps of the present invention respectively.

Figure 1:
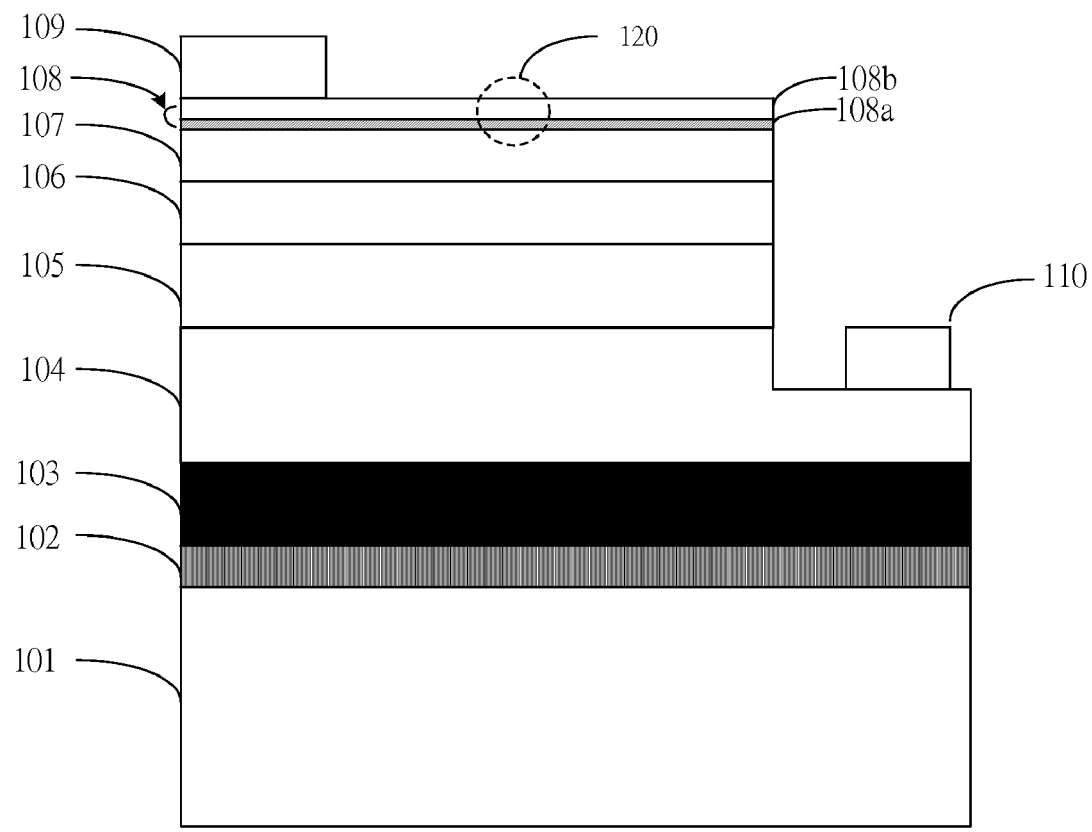
FIG. 1 is a schematic diagram showing the epitaxial structure of a conventional GaN-based LED.
Figure 2:
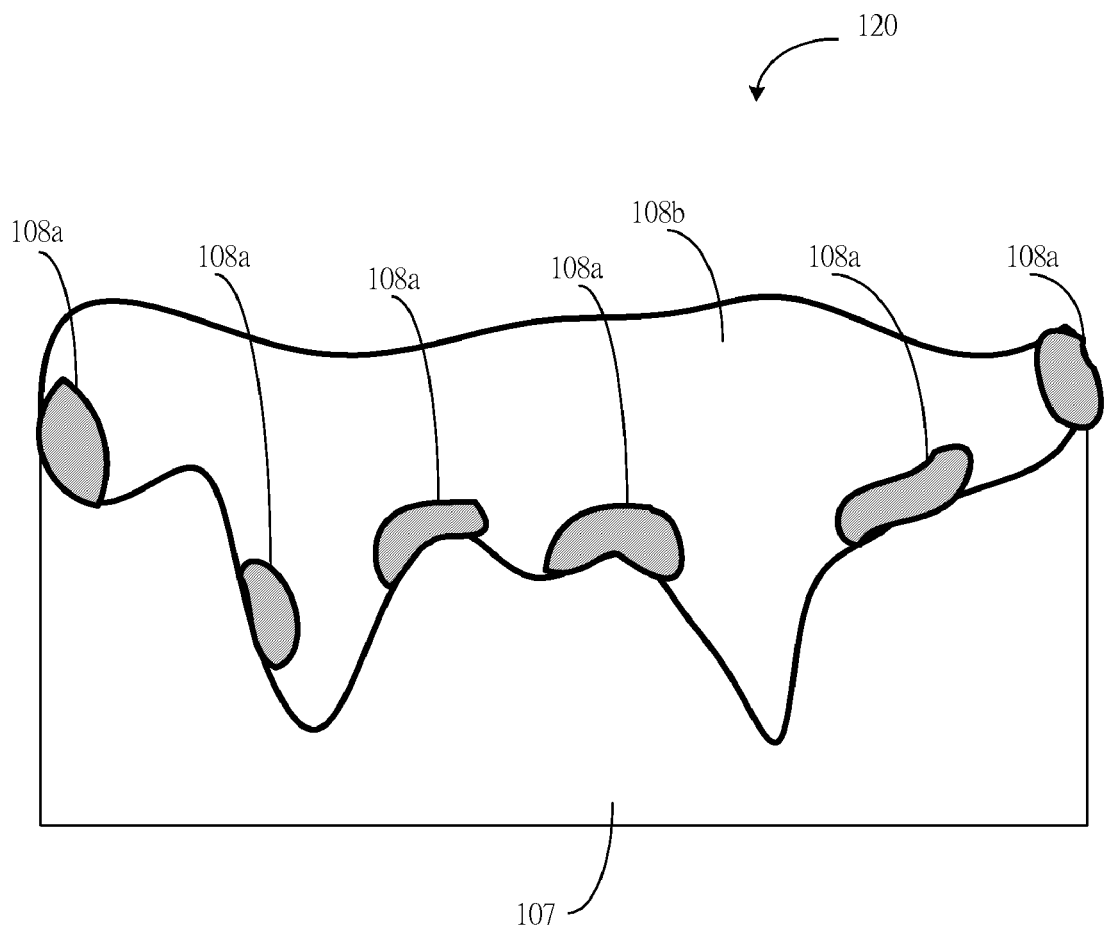
FIG. 2 is a schematic diagram showing an enlargement of the interface between the p-type transparent metallic conductive layer and the p-type ohmic contact layer as depicted in FIG. 1.
Figure 3A:
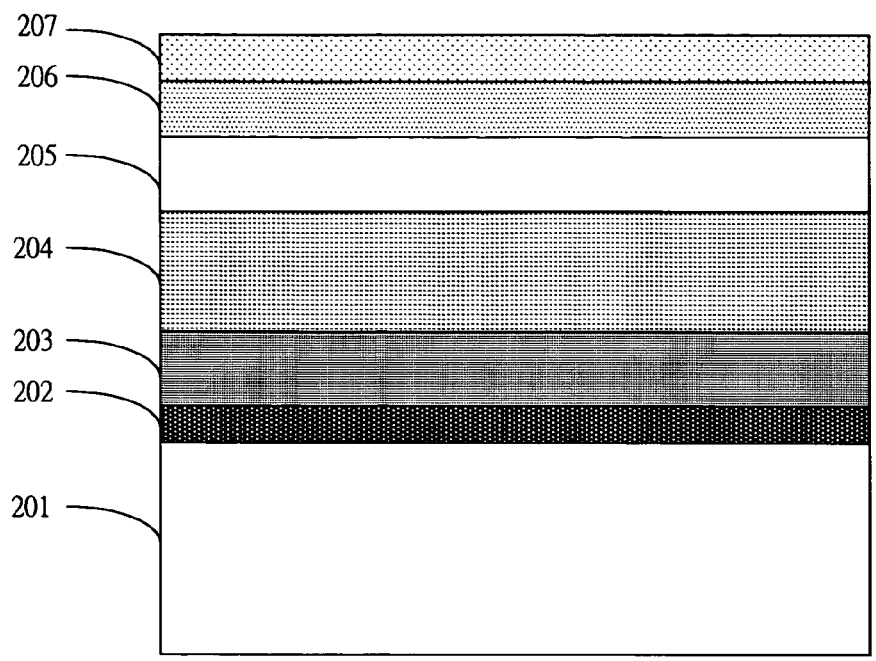
FIGS. 3(a)–3(d) are schematic diagrams showing the epitaxial structure of a GaN-based LED after the processing steps of the present invention respectively.

As shown in FIG. 3(a), a sapphire substrate 201 is provided. Then, on top of the substrate 201, a number of GaN-based epitaxial layers are developed. The material used for forming these epitaxial layers could be described by the following molecular formulas:

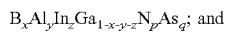

and

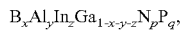

where $0 \leq x \leq 1$, $0 \leq y \leq 1$, $0 \leq z \leq 1$, $0 \leq p \leq 1$, $0 \leq q \leq 1$, and $x+y+z=1$, $p+q=1$.

The epitaxial layers are developed as follows. A low-temperature buffer layer 202 is first grown on top of the substrate 201 under a low temperature. The low-temperature buffer layer 202 has a thickness between 200 and 300 Å. Then a high-temperature buffer layer 203 is formed on top of the low-temperature buffer layer 202 under a high temperature. The high temperature buffer layer 203 has a thickness around 0.7 μm. Both the low-temperature and high-temperature buffer layers 202 and 203 are made of GaN-based compound material $Al_xGa_{1-x}N$ ($0 \leq x \leq 1$). An n-type ohmic contact layer 204 is then formed on top of the high-temperature buffer layer 203. The n-type ohmic contact layer 204 is made of an n-type GaN having a doping density around 3e+18 to 5e+18 $cm^{-3}$, and has a thickness between 2 and 5 μm. In the following, an active layer 205 made of un-doped InGaN is formed. On top of the active layer 205, a cladding layer 206 made of a p-type AlGaN having a doping density between 3e+17 and 5e+17 $cm^{-3}$, and a p-type ohmic contact layer 207 made of a p-type GaN having a doping density between 3e+17 and 1e+18 $cm^{-3}$. The p-type ohmic contact layer 207 has texturing surface.

Figure 3B:
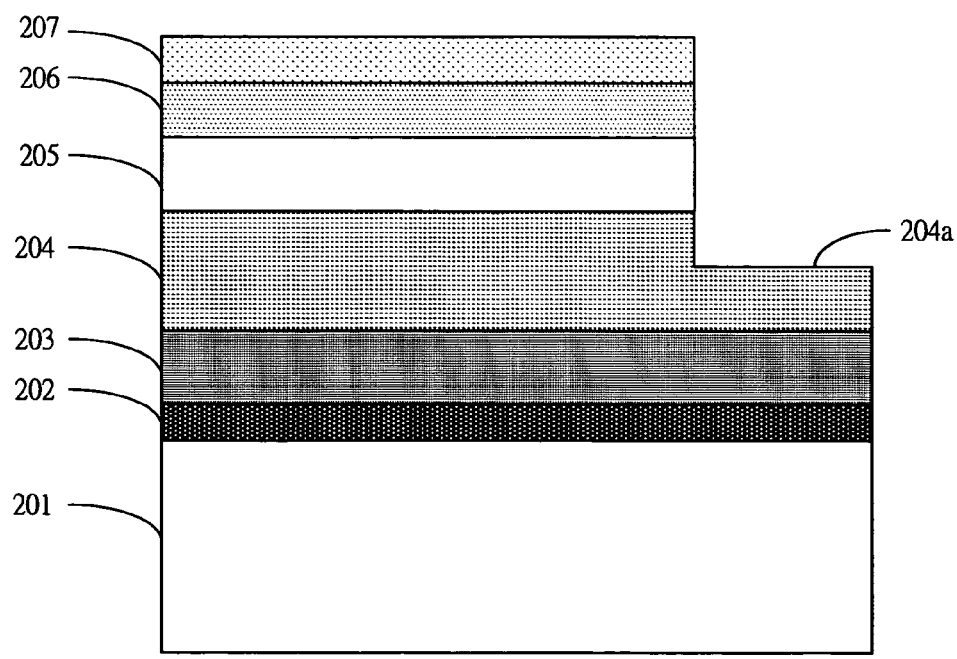

As shown in FIG. 3(b), after the foregoing epitaxial layers are developed, a dry etching process is conducted to remove a part of the p-type ohmic contact layer 207, the cladding layer 206, the active layer 205, the n-type ohmic contact layer 204 so as to expose an area 204a of the n-type ohmic contact layer 204.

Figure 3C:
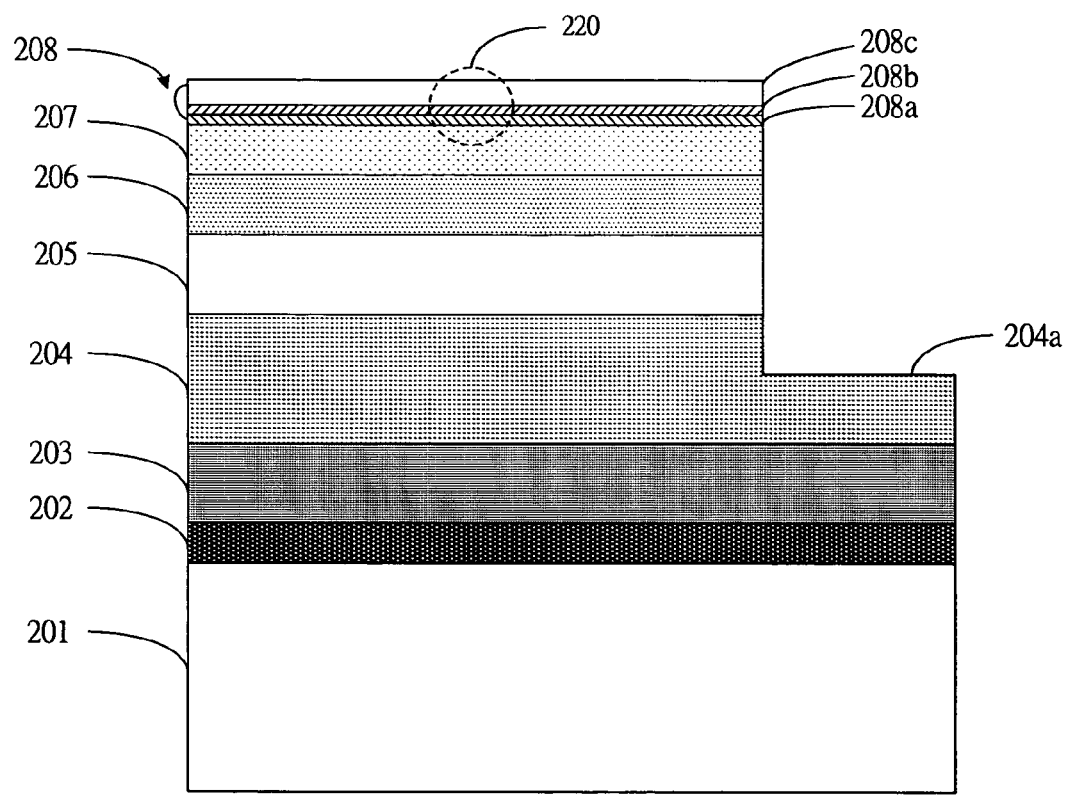

Then, as shown in FIG. 3(c), an evaporation process is conducted to form a p-type transparent metallic conductive layer 208 on top of the p-type ohmic contact layer 207. The evaporation process contains the following steps.

At first, a buffered oxide etchant and $(NH_4)_2S_x$ solution are used to clean the surface of the p-type ohmic contact layer 207 and the area 204a of the n-type ohmic contact layer 204 for about 10 minutes respectively.

Secondly, a first contact spreading metallic layer 208a having a thickness between 5 and 50 Å, a second contact spreading metallic layer 208b having a thickness between 10 and 100 Å, and a third contact spreading metallic layer 208c having a thickness between 20 and 100 Å are sequentially formed in this order from bottom to top on the p-type ohmic contact layer 207 using E-beam evaporation. The first contact spreading metallic layer 208a could be made by one of the material Au, Pt, Pd, Rh, Mg, Nb, Zr, and W. The second and third contact spreading metallic layers 208b and 208c could be made by one of the transition metals or their oxides, one of the noble metals or their oxides, or one of the material ITO, ZnO, $In_2O_3$, $SnO_2$, (LaO)CuS, $(La_{1-x}Sr_xO)CuS$, respectively. In some preferred embodiments, the materials used to form the three contact spreading metallic layers 208a, 208b, 208c could be one of the following combinations (in corresponding order) respectively: Au, Ni, Au; Pt, Ru, Au; Pt, Au, In:$SnO_2$; Au, NiO, Au; Pt, $RuO_2$, Au.

The three contact spreading metallic layers are then alloyed in an annealing furnace within an oxygenic or a nitrogenous environment under a temperature between 400 and 600° C. for 1 to 10 minutes. With the foregoing preferred embodiments of the three contact spreading metallic layers, an Au/NiO/Au, Pt/$RuO_2$/Au, or Pt/Au/In:$SnO_2$ structure would be formed in an oxygenic environment after the annealing process. On the other hand, with the foregoing preferred embodiments of the three contact spreading metallic layers, an Au/Ni/Au, Pt/Ru/Au, or Pt/Au/In:$SnO_2$ structure would be formed in a nitrogenous environment after the alloying process. All these structures could reduce the contact resistivity with the p-type ohmic contact layer 207 and enhance the electrical current's lateral distribution.

Figure 3D:
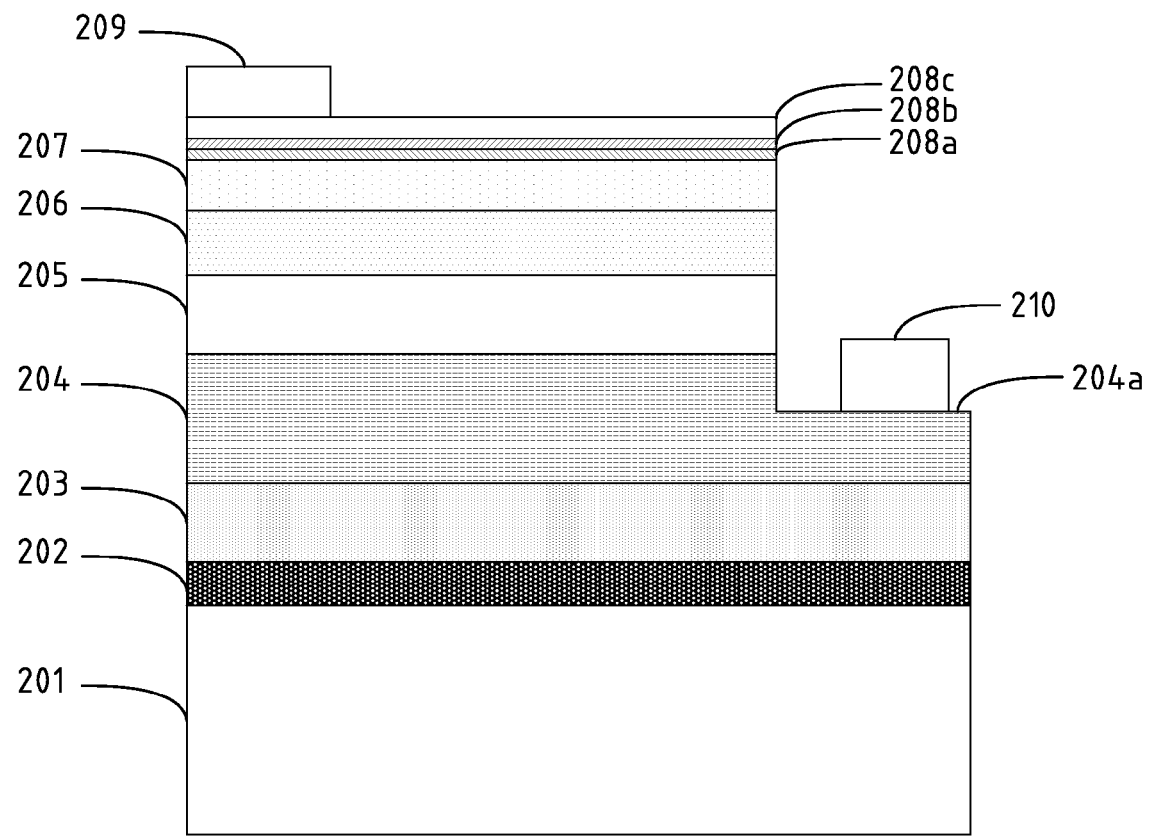

At last, as shown in FIG. 3(d), after the development of the p-type transparent metallic conductive layer 208, a p-type metallic electrode 209 is formed on the p-type transparent metallic conductive layer 208, and an n-type electrode 210 is formed on top of the area 204a of the n-type ohmic contact layer 204.

Figure 4:
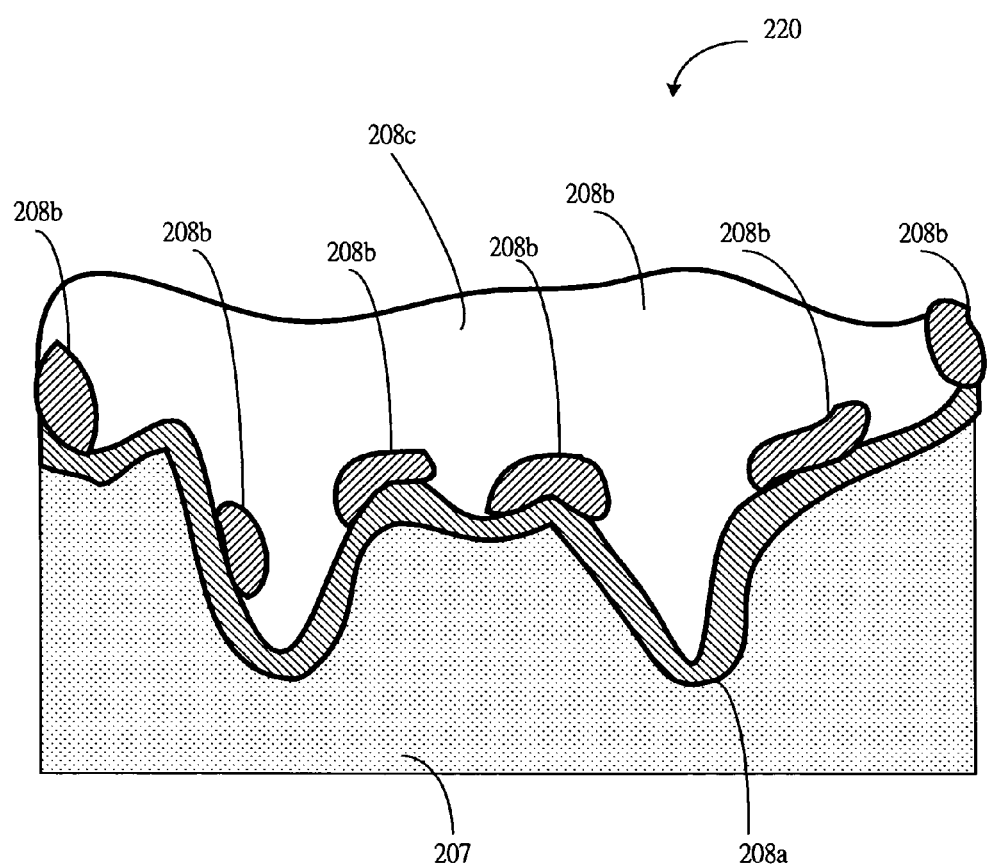
FIG. 4 is a schematic diagram showing an enlargement of the interface between the p-type transparent metallic conductive layer and the p-type ohmic contact layer as depicted in FIG. 3(c).

FIG. 4 is a schematic diagram showing an enlargement of the interface 220 between the p-type transparent metallic conductive layer 208 and the p-type ohmic contact layer 207 as depicted in FIG. 3(c). As shown in FIG. 4, the first contact spreading metallic layer 208a has an even contact with the p-type ohmic contact layer 207 so that the GaN-based LED has a uniform lighting.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A GaN-based LED structure, comprising:
   a substrate;
   a plurality of GaN-based epitaxial layers on top of said substrate, said plurality of epitaxial layers comprising a low-temperature buffer layer, a high-temperature buffer layer, an n-type ohmic contact layer, an active layer, a cladding layer, a p-type ohmic contact layer having a texturing surface; and
   a p-type transparent metallic conductive layer on top of said texturing surface of said p-type ohmic contact layer;
   wherein said p-type transparent metallic conductive layer comprises:
   a first contact spreading metallic layer on top of said texturing surface of said p-type ohmic contact layer;
   a second contact spreading metallic layer on top of said first contact spreading metallic layer; and
   a third contact spreading metallic layer on top of said second contact spreading metallic layer.

2. The GaN-based LED structure as claimed in claim 1, wherein a part of said p-type ohmic contact layer, said cladding layer, said active layer, and said n-type ohmic contact layer has been removed so that an area of said n-type ohmic contact layer is exposed.

3. The GaN-based LED structure as claimed in claim 1, wherein each of said plurality of epitaxial layers is made of a material selected from the group consisting of $B_xAl_yIn_zGa_{1-x-y-z}N_pAs_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$) and $B_xAl_yIn_zGa_{1-x-y-z}N_pP_q$ ($0 \leq x \leq 1$, $0 \leq y \leq 1$, $0 \leq z \leq 1$, $0 \leq p \leq 1$, $0 \leq q \leq 1$, and $x+y+z=1$, $p+q=1$).

4. The GaN-based LED structure as claimed in claim 1, wherein said first contact spreading metallic layer is made of a material selected from the group consisting of Au, Pt, Pd, Rh, Mg, Nb, Zr, and W.

5. The GaN-based LED structure as claimed in claim 1, wherein said second and said third contact spreading metallic layers are made of a material selected from the group consisting of transition metals, oxides of transition metals, noble metals, oxides of noble metals, ITO, ZnO, $In_2O_3$, $SnO_2$, (LaO)CuS, and $(La_{1-x}Sr_xO)CuS$, respectively.

6. The GaN-based LED structure as claimed in claim 1, wherein said first, said second, and said third contact spreading metallic layers are made of materials selected from one of the following combinations in corresponding order respectively: Au, Ni, Au; Pt, Ru, Au; Pt, Au, In:$SnO_2$; Au, NiO, Au; and Pt, $RuO_2$, Au.

7. The GaN-based LED structure as claimed in claim 1, wherein said first contact spreading metallic layer has a thickness between 5 and 50 Å.

8. The GaN-based LED structure as claimed in claim 1, wherein said second contact spreading metallic layer has a thickness between 10 and 100 Å.

9. The GaN-based LED structure as claimed in claim 1, wherein said third contact spreading metallic layer has a thickness between 20 and 100 Å.

10. The GaN-based LED structure as claimed in claim 1 further comprising a p-type metallic electrode on top of said p-type transparent metallic conductive layer.

11. The GaN-based LED structure as claimed in claim 2 further comprising an n-type metallic electrode on top of said area of said n-type ohmic contact layer.

* * * * *